United States Patent [19]
Noguchi et al.

[11] Patent Number: 5,883,013
[45] Date of Patent: *Mar. 16, 1999

[54] METHOD OF PRODUCING SEMICONDUCTOR DEVICE

[75] Inventors: Takatoshi Noguchi; Norihiko Kiritani, both of Yokosuka, Japan

[73] Assignee: Nissan Motor Co., Ltd., Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 578,127

[22] Filed: Dec. 26, 1995

[30] Foreign Application Priority Data

Dec. 26, 1994 [JP] Japan ..................... 6-321918

[51] Int. Cl.$^6$ .................................. H01L 21/31
[52] U.S. Cl. .................. 438/780; 438/770; 438/778; 438/781; 438/787
[58] Field of Search ............. 437/235; 438/725, 438/713, 715, 719, 702, 781, 514, 530, 125, 126, 127, 770, 778; 427/515, 521, 558, 65

[56] References Cited

U.S. PATENT DOCUMENTS

| | | | |
|---|---|---|---|
| 4,118,595 | 10/1978 | Pfahnl et al. | 174/68.5 |
| 4,944,893 | 7/1990 | Tanaka et al. | 252/171 |
| 5,208,066 | 5/1993 | Fujisaki et al. | 427/96 |
| 5,244,820 | 9/1993 | Kamata et al. | 438/514 |
| 5,270,259 | 12/1993 | Ito et al. | 437/235 |

FOREIGN PATENT DOCUMENTS 52-44703 11/1977 Japan.
60-11458 3/1985 Japan.

OTHER PUBLICATIONS

Ayahito Horinouchi et al, Sweep Rate Dependence of I–V Characteristics in Electrochemical Silicon Etch–Stop, Technical Digest of 9th Sensor Symposium, 1990, pp. 19–22.

Product specification of KRS–1 and KRS–2 of Kanto Chemical Co. is cited on p. 6 of the specification.

Product specification of Silicone Dissolving Agent SSI–3 of Mitsu Kagaku Co.

Product specification of KRS–1 and KRS–2 of Kanto Chemical Co. is cited on p. 6 of the specification, published Nov., 1992.

Product specification of Silicone Dissolving Agent SSI–3 of Mitsu Kagaku Co, published on Apr. 1, 1991.

*Primary Examiner*—Charles Bowers
*Assistant Examiner*—Renée R. Berry
*Attorney, Agent, or Firm*—McDermott, Will & Emery

[57] ABSTRACT

A method of forming a silicone resin film for protecting a semiconductor substrate on the substrate for a certain period of time and then removing the film from the substrate including the steps of: (a) forming the silicone resin film, on at least one portion of the substrate; (b) treating the film with an organic solvent, so that a majority of the film is dissolved in the organic solvent and thereby removed from the substrate and that a residue remains on the substrate; (c) oxidizing the residue to silicon oxide; and (d) treating the silicon oxide with an aqueous solution containing at least one of hydrogen fluoride and ammonium fluoride, so as to dissolve the silicon oxide in the solution and to thereby remove the silicon oxide from the substrate is described. The silicone resin film formed on the substrate can be easily completely removed, without damaging the electrical characteristics of the semiconductor.

19 Claims, 3 Drawing Sheets

METHOD OF PRODUCING SEMICONDUCTOR DEVICE

BACKGROUND OF THE INVENTION

1. Field of the Invention

The present invention relates in general to a method of producing a semiconductor device and more particularly to a method of forming a silicone resin film for protecting a semiconductor substrate on the substrate and then removing the film from the substrate.

2. Description of the Prior Art

Silicone resin, which contains organopolysiloxane, is superior in heat resistance and cold resistance. It is also superior in chemical resistance and thus hardly damaged by strong alkali and strong acid chemicals. Furthermore, it is superior in adhesion to various materials such as silicon, ceramics and metals (e.g., aluminum). Therefore, it is widely used in various fields.

Horinouchi et al. (1990) Technical Digest of the 9th Sensor Symposium, pp. 19–22 discloses a silicon wafer that is covered with a coating resin, except the front surface thereof (see FIG. 2).

Japanese Patent Second Publication JP-B-52-44703 discloses a method of producing a semiconductor device that has a npn transistor embedded in the surface of a substrate thereof.

In this method, at first, the substrate is irradiated with gas plasma such as an oxygen or argon plasma so as to decrease the current amplification factor of the transistor to a predetermined value. Then, the substrate is subjected to a heat treatment so as to increase the current amplification factor to the desired value.

Japanese Patent Second Publication JP-B-60-11458 discloses a method of producing a semiconductor device, in which a silicone resin is used, particularly as an insulating layer's material. In this method, at first, aluminum is deposited on a semiconductor's substrate 11. Then, the deposited aluminum is etched to form a first layer wiring 12 on the substrate 11. Then, a silicone resin layer 13 having a thickness of about 100 nm is formed so as to cover the first layer wiring 12 therewith (see FIG. 2(a)). Then, the silicone resin layer 13 is optionally heated to harden the same. Then, a patterning mask 17 such as photoresist or phosphosilicate glass (PSG) is formed on the silicone resin layer 13 (see FIG. 2(b)). Then, the exposed portion of the silicone resin layer 13 is oxidized to silicon oxide 16 by irradiating the semiconductor substrate 11 with an oxygen plasma for about 15 min under an oxygen gas pressure of 1 Torr at a power of 100 W (see FIG. 2(c)). Then, the thus formed silicon oxide 16 is removed by etching with a hydrofluoric acid containing solution (see FIG. 2(d)).

If the method according to JP-B-60-11458 is applied to remove a silicone resin film for protecting a semiconductor substrate, which film, has a much greater thickness (at least 10 $\mu$m) than that (about 100 nm) of JP-B-60-11458, it is very difficult to completely oxidize the silicone resin film to silicon oxide, even if the power and the period of time of the irradiation of JP-B-60-11458 are increased to a great extent. If a silicone resin film is irradiated with the oxygen plasma under the same conditions as those described in JP-B-60-11458, a transistor embedded in the surface of a semiconductor substrate may be greatly lowered in the current amplification factor, as shown in FIG. 3 of JP-B-52-44703. Furthermore, when a silicone resin which is reinforced with filler is used for increasing the strength of a semiconductor substrate and thus for forming a diaphragm of semiconductor pressure sensor, it may be impossible to completely oxidize the silicone resin layer to silicon oxide by the method of JP-B-60-11458.

SUMMARY OF THE INVENTION

It is therefore an object of the present invention to provide an improved method of producing a semiconductor device, which is free of the above-mentioned drawbacks.

It is a more specific object of the present invention to provide an improved method of producing a semiconductor device, in which a silicone resin film containing an organopolysiloxane, formed on a semiconductor substrate, can be easily completely removed, without damaging the electrical characteristics of the semiconductor device.

According to a first aspect of the present invention, there is provided a method of producing a semiconductor device, said method comprising the steps of:

(a) forming a film containing an organopolysiloxane, on at least one portion of a substrate of said semiconductor device;

(b) treating said film with an organic solvent, so that a majority of said film is dissolved in said organic solvent and thereby removed from said substrate and that a residue remains on said substrate;

(c) oxidizing said residue to silicon oxide; and (d) treating said silicon oxide with an aqueous solution containing at least one of hydrogen fluoride and ammonium fluoride, so as to dissolve said silicon oxide in said solution and to thereby remove said silicon oxide from said substrate.

According to a second aspect of the present invention, there is provided a method of producing a semiconductor device, said method comprising the steps of:

(a) forming a film containing an organopolysiloxane, on at least one portion of a substrate of said semiconductor device;

(b) treating said film with an organic solvent, so that a majority of said protective film is dissolved in said organic solvent and thereby removed from said substrate and that a first residue remains on said substrate;

(c) treating said first residue with a first aqueous solution containing at least one of hydrogen fluoride and ammonium fluoride, so that at least a portion of said first residue is dissolved in said first solution and removed from said substrate and that a second residue, which is less than said first residue in thickness, remains on said substrate;

(d) oxidizing said second residue to silicon oxide; and (e) treating said silicon oxide with a second aqueous solution containing at least one of hydrogen fluoride and ammonium fluoride so as to dissolve said silicon oxide in said second solution and to thereby remove said silicon oxide from said substrate.

Hitherto, it has been considered that a silicone resin film is completely removed by a commercial silicone-resin dissolving agent containing alkylbenzene sulfonic acid dissolved in an organic solvent thereof. However, the present inventors have unexpectedly found that a residue, which has a very thin thickness such as not greater than 0.01 $\mu$m, always inevitably remains on a substrate, after the treatment of the silicone resin film with the silicone-resin dissolving agent, irrespective of the thickness of the silicone resin film formed on the substrate. This residue has been judged by us as not being a silicone resin nor silicon oxide. We have still further unexpectedly found that, although the residue has been judged as not being a silicone resin, the residue can be completely oxidized to silicon oxide and that this silicon oxide can be completely removed by the treatment with an aqueous solution containing at least one of hydrogen fluoride and ammonium fluoride. We further unexpectedly found that the silicon oxide formed by oxidizing the residue can be easily completely removed by the treatment with a PSG film etching solution.

In the invention, a majority of the silicone resin film is removed from the substrate by treating the silicone resin film with the organic solvent. Therefore, the residue remaining on the substrate after the treatment with the organic solvent is much less than the silicone resin film before this treatment, in thickness. Therefore, when the residue is oxidized, for example, by irradiating the residue with an oxygen plasma, the irradiation conditions (e.g., the power and the period of time of the irradiation) can be well controlled so as not to damage the electrical characteristics of the semiconductor device, as compared with the irradiation of the silicone resin film itself with the oxygen plasma.

DESCRIPTION OF THE PREFERRED EMBODIMENTS

Figure 1:
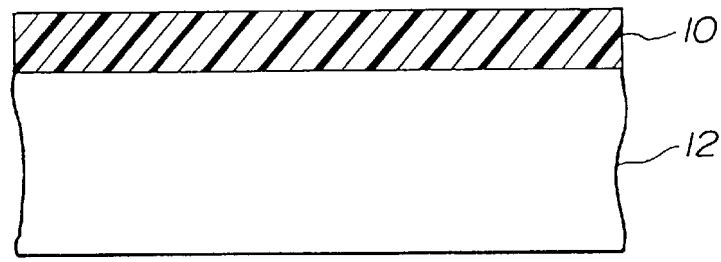
FIGS. 1–4 are elevational sectional views, showing sequential steps, in accordance with the first aspect of the present invention, of forming a silicone resin film on a semiconductor substrate and then removing the silicone resin layer from the substrate.

In the invention, the silicone resin film coated on the substrate is hardened, for example, by heating the film. However, the film may be hardened by plasma polymerization or electrolytic polymerization. The silicone resin film used as a protective film may contain an additive(s) such as filler.

In the invention, a majority of the silicone resin film is removed from the substrate by treating the silicone resin film with the organic solvent. Therefore, the residue remaining on the substrate after the treatment with the organic solvent is much less than the silicone resin film before this treatment, in thickness. According to the present invention, even in case that an additional layer (e.g., a silicon oxide layer or a phosphosilicate glass (PSG) layer) is interposed between the semiconductor substrate and the silicone resin film, the over-etching time can be reduced. Therefore, the etching effect on the substrate can be greatly reduced.

In the invention, the silicone resin film has a thickness (e.g., at least 10 μm) for the purpose of, for example, protecting the semiconductor substrate for a certain period of time in the process of the semiconductor device. In other words, for example, a circuit embedded in the front surface of the substrate is protected by the silicone resin film when the back surface of this substrate is etched. After achieving the protection of the substrate, it is necessary to completely remove the silicone resin film from the substrate. However, the silicone resin film according to the present invention is not limited to a film for protecting the substrate. In other words, the silicone resin film may be used as a fixing means for temporarily fixing parts or as a temporal sealing means.

In the invention, preferable examples of the organic solvent for removing a majority of the silicone resin film from the semiconductor substrate are commercial silicone dissolving agents of Mitsu Kagaku Co., commercial silicone-resin dissolving agents such as KSR SERIES (trade name) of Kanto Chemical Co, and commercial resist remover such as NAGASE RESIST STRIP N-530 (trade name) of Nagase Denshi Co. In the following, the organic solvent will be referred to as a silicone resin remover, too. Each of the preferable examples of the silicone resin remover contains several tens of percent of alkyl benzene sulfonic acid dissolved in an organic solvent. It is considered that this alkyl benzene sulfonic acid in the remover is very effective for dissolving the silicone resin in the remover and thus removing the resin from the substrate. However, as is mentioned hereinabove, we unexpectedly found that a residue remains on the substrate even after the treatment of the silicone resin film with the remover and that this residue is. judged as not being a silicone resin nor silicon oxide.

In the invention, in case that the residue is irradiated with an oxygen plasma for oxidizing the residue to silicon oxide, the irradiation power and time are respectively within, for example, a range not greater than 200 W and, for example, a range not longer than 5 min. Within these exemplary ranges, the effect of the irradiation on the current amplification factor of a transistor embedded in the substrate surface becomes substantially small.

In the invention, the method of oxidizing the residue to the silicon oxide is not limited to the above-mentioned irradiation with the oxygen plasma. For example, this oxidation can be conducted by the irradiation with ultraviolet rays in the atmosphere of the oxygen gas. In this case, elements on the substrate are not affected at all by the oxidation. As another example, the oxidation can be conducted by the heat treatment at a high temperature in the atmosphere of the oxygen gas. In this case, an apparatus for producing a semiconductor device can be used for the heat treatment. Therefore, it is not necessary to provide a particular apparatus only for the oxidation, and thus the production cost of the semiconductor device can be reduced. As still another example, the oxidation can be conducted by the immersion of the residue in a solution mixture of hot concentrated sulfuric acid and hydrogen peroxide aqueous solution. In this case too, an apparatus for producing a semiconductor device can be used for the immersion process, and this process can be conducted very easily and very speedily. Thus, the production cost can be greatly reduced.

According to the second aspect of the present invention, the first residue formed by treating the silicone resin film with the organic solvent is additionally etched with the first aqueous (etching) solution. Therefore, the second residue is much less than the first residue in thickness. With this, as is exemplified in Examples 1 and 2, the irradiation time can be further reduced. Therefore, the effect of the irradiation on the current amplification factor of the transistor can be further decreased. In the second aspect of the present invention, the first aqueous solution may be identical with or different from the second aqueous solution, in composition.

In the invention, examples of the aqueous (etching) solution are a diluted hydrofluoric-acid aqueous solution in which the volumetric ratio of water to hydrogen fluoride is, for example, 20:1, and BHF (i.e., solution mixtures each containing ammonium fluoride and hydrogen fluoride). However, the aqueous solution is not limited to the above-mentioned examples, as long as the aqueous solution contains at least one of hydrogen fluoride and ammonium fluoride.

A further example of the aqueous solution is a PSG-film etching solution, which is composed of equi-volumetric amounts of $NH_4F$, $CH_3COOH$ and $H_2O$ (i.e., the volumetric ratio of $NH_4F/CH_3COOH/H_2O$ is 1/1/1). The silicon oxide layer formed according to the present invention can be also removed by the etching with this further example for 10 seconds. Thus, even when a semiconductor substrate has an aluminum wiring thereon, the silicone resin layer can be removed from the substrate, using this further example, without damaging the substrate.

The present invention will be illustrated with reference to the following nonlimitative Examples 1 and 2.

EXAMPLE 1

In this example, a silicone resin film was formed on a semiconductor substrate and then removed from the substrate, in accordance with a first aspect of the present invention, as follows.

As is seen from FIG. 1, at first, a silicone resin film 10 was formed on a semiconductor substrate 12, using a silicone resin (JUNCTION COATING RESIN KJR-4013 (trade name) of Shin-Etsu Chemical Co.), so that the silicone resin film 10 had a thickness of about 200 $\mu$m and that a circuit (not shown in the illustration) embedded in the substrate's top surface was covered with the silicone resin film 10. In other words, this circuit was in a cavity (not shown in the illustration) formed on the substrate's top surface. Then, the substrate 10 coated with the silicone resin film 10 was allowed to stand still for a time not shorter than 12 hr at room temperature. Then, the silicone resin film 10 was subjected to a heat treatment at a temperature of 100° C. for a time not shorter than 8 hr, to harden the silicone resin film 10.

Figure 2:
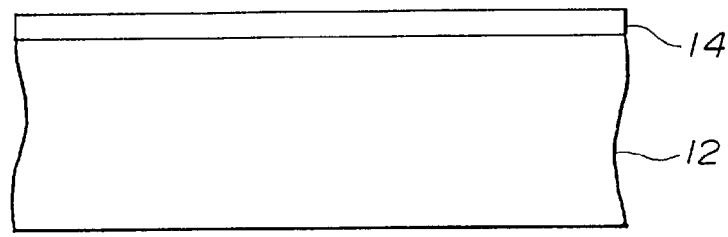

Then, the silicone resin film 10 was immersed for 20 min in an organic solvent (NAGASE RESIST STRIP N-530 (trade name) of Nagase Denshi Co.) containing 20–30 wt% of alkylbenzene sulfonic acid, while this organic solvent was maintained at 100 ° C. With this, as is seen from FIG. 2, a majority of the silicone resin film 10 was dissolved in the solvent and thus removed from the substrate 12, and it was found that a residue 14 remains on the substrate 12.

In fact, the existence of this residue 14 removed from the tope surface of the substrate 12 was confirmed by the naked eye, when a pincette was scraped thereagainst.

Figure 5:
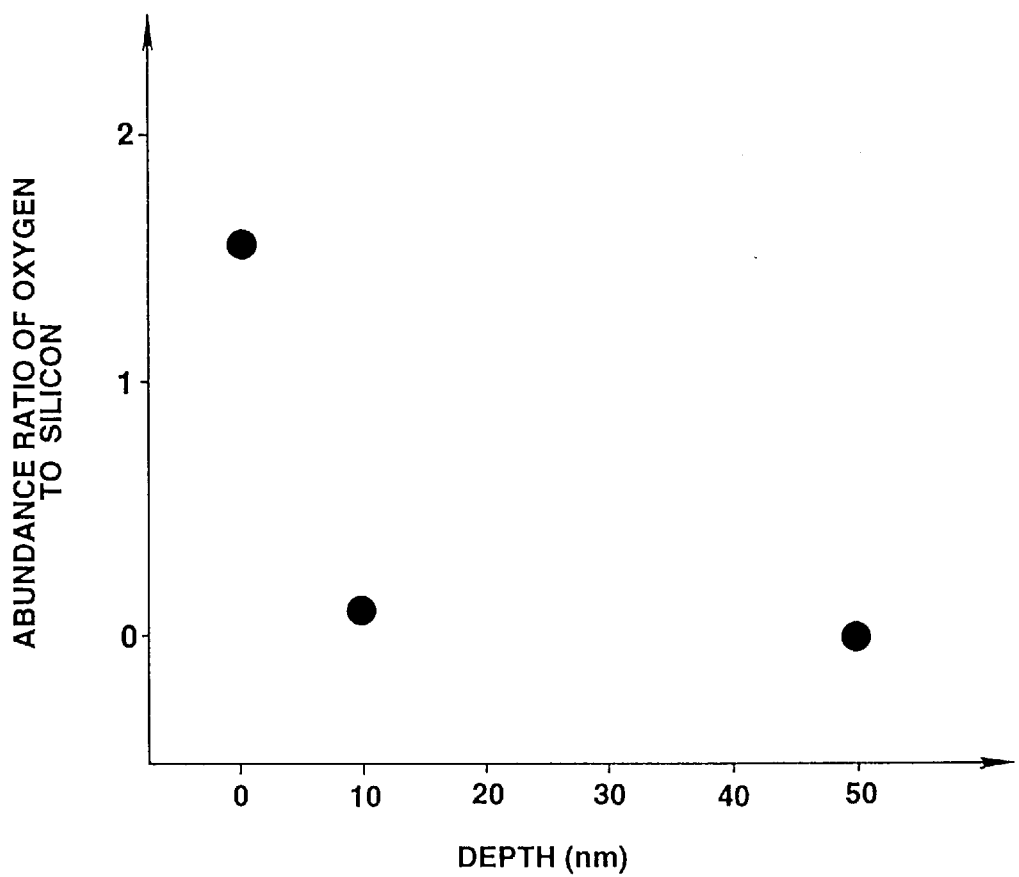
FIG. 5 is a graph, according to Example 1 of the present invention, showing the abundance ratio of the oxygen atom number to the silicon atom number at certain depths which are distances downward from the top surface of the residue toward the bottom surface of the substrate.

The abundance ratio of the oxygen atom number to the silicon atom number was determined at certain depths which are distances downward from the top surface of the residue 14 toward the bottom surface of the substrate 12, by a known x-ray photoelectron spectroscopy (XPS) analysis. The result is shown in FIG. 5. As is shown in FIG. 5, the oxygen atom was almost not found at a depth of 10 nm. With this, it is understood that the depth of 10 nm is positioned on the top surface of or in the inside of the substrate 12, because the substrate 12 was made of only silicon. Therefore, it is further understood that the thickness of the residue 14 was not more than 10 nm.

Figure 3:
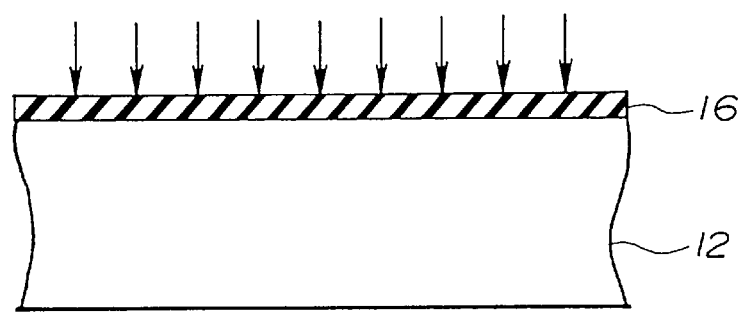

After the immersion in the solvent, as is seen from FIG. 3, the residue 14 was irradiated with an oxygen plasma under an oxygen pressure of 1 Torr at a power of 100 W for about 2 min, thereby oxidizing the residue 14 to a silicon oxide (SiOx where X is a number not greater than 2) layer 16. It was found that, when a lateral-type npn transistor having a current amplification factor of 200 was embedded in the substrate surface, this transistor was not almost changed in the factor, after the irradiation with the oxygen plasma under the above-mentioned conditions.

Figure 4:
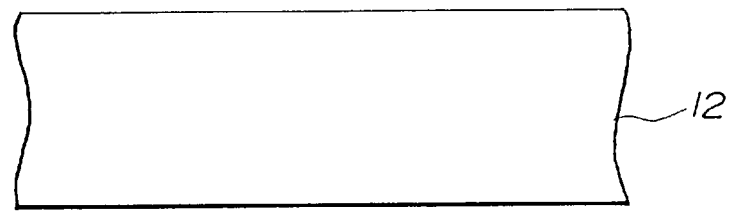

After the irradiation with the oxygen plasma, the silicon oxide layer 16 was subjected to an etching with a diluted hydrofluoric acid etching solution for 10 seconds. This solution contained water and hydrogen fluoride in a volumetric ratio of water to hydrogen fluoride of 20:1. With this, as is seen from FIG. 4, the silicon oxide layer 16 was completely dissolved in the etching solution and completely removed from the substrate 12.

EXAMPLE 2

In this example, a silicone resin film was formed on a semiconductor substrate and then removed from the substrate in accordance with the second aspect of the present invention, as follows.

Figure 6:
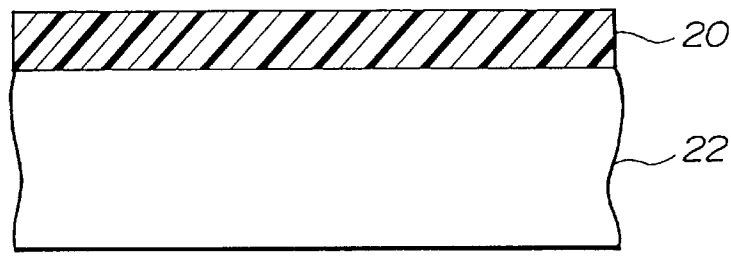
FIGS. 6–9 are views which are respectively similar to FIGS. 1–4, but in accordance with the second aspect of the present invention.
Figure 7:
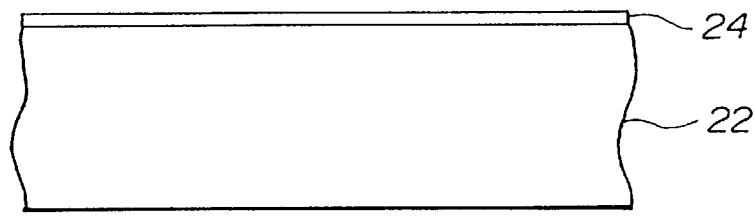
Figure 8:
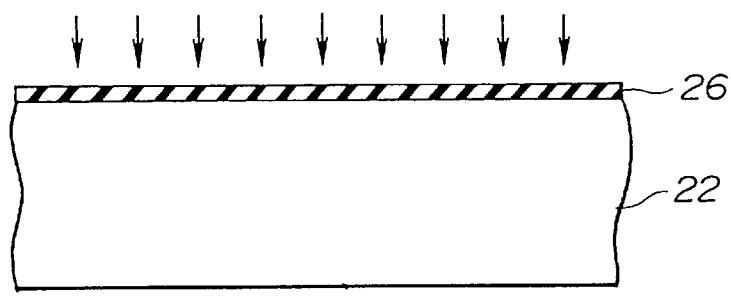
Figure 9:
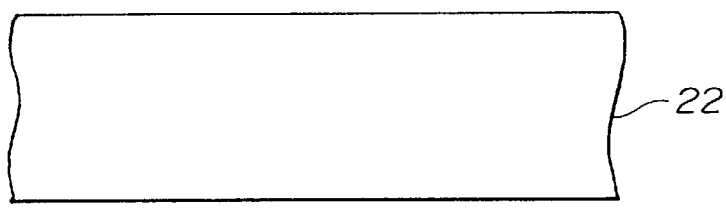

As is seen from FIG. 6, at first, a silicone resin film 20 was formed on a semiconductor substrate 22 in the same manner as in Example 1. Then, the substrate 22 coated with the silicone resin film 20 was allowed to stand still, and then subjected to a heat treatment, respectively in the same manners as in Example 1. Then, the silicone resin film 20 was immersed in the same organic solvent as that of Example 1, in the same manner as in Example 1. With this, a majority of the silicone resin film 20 was dissolved in the solvent and thus removed from the substrate 22, and it was found that a first residue (not shown in the illustration) remains on the substrate 22. Then, this first residue was etched with an etching solution, in the same manner as in Example 1. With this, as is seen from FIG. 7, it was found that a second residue 24, which is less than the first residue in thickness, remains on the substrate 22. Then, as is seen from FIG. 8, the second residue 24 was irradiated with the oxygen plasma under an oxygen pressure of 1 Torr at a power of 100 W for about 1 min, thereby oxidizing the second residue to a silicon oxide layer 26. After the irradiation, the silicon oxide layer 26 was subjected to the same etching treatment as in Example 1. With this, as is seen from FIG. 9, the silicon. oxide layer 26 was completely dissolved in the etching solution and completely removed from the substrate 22.

What is claimed is:

1. A method of manufacturing a semiconductor device comprising the steps of:

(a) treating a film comprising an organopolysiloxane on at least a portion of a substrate of said semiconductor device wherein a circuit is embedded on a front surface of said substrate, with an organic solvent to dissolve and remove a majority of the film from said substrate, such that a residue remains on said substrate;

(b) oxidizing said residue to silicon oxide; and (c) treating said silicon oxide with an aqueous solution comprising at least one of hydrogen fluoride and ammonium fluoride to dissolve and to remove said silicon oxide from said substrate.

2. A method according to claim 1, wherein the step (c) is conducted by irradiating said residue with an oxygen plasma, and wherein the irradiation is controlled such that the electrical conditions of the semiconductor device are substantially undamaged.

3. A method according to claim 1, wherein said circuit comprises aluminum wiring.

4. A method of manufacturing a semiconductor device, said method comprising the steps of:

(a) treating a film comprising an organopolysiloxane on at least a portion of a substrate of said semiconductor device wherein a circuit is embedded on a front surface of said substrate, with an organic solvent to dissolve and remove a majority of the film from said substrate, such that a first residue remains on said substrate;

(b) treating said first residue with a first aqueous solution comprising at least one of hydrogen fluoride and ammonium fluoride to dissolve and to remove at least a portion of said first residue from said substrate, such that a second residue, which is less thick than said first residue remains on said substrate;

(c) oxidizing said second residue to silicone oxide; and (d) treating said silicone oxide with a second aqueous solution comprising at least one of hydrogen fluoride and ammonium fluoride to dissolve and to remove said silicon oxide from said substrate.

5. A method according to claim 4, wherein the step (c) is conducted by irradiating said residue with an oxygen plasma, and wherein the irradiation is controlled such that the electrical conditions of the semiconductor device are substantially undamaged.

6. A method according to claim 4, wherein said circuit comprises aluminum wiring.

7. A method of manufacturing a semiconductor device, said method comprising the steps of:

(a) forming a film containing an organopolysiloxane, on at least one portion of a substrate of said semiconductor device wherein a circuit is embedded on a front surface of said substrate;

(b) treating said film with an organic solvent, so that a majority of said film is dissolved in said organic solvent and thereby removed from said substrate and that a residue remains on said substrate;

(c) oxidizing said residue to silicon oxide; and (d) treating said silicon oxide with an aqueous solution containing at lest one hydrogen fluoride and ammonium fluoride, so as to dissolve said silicon oxide in said solution and to thereby remove said silicon oxide from said substrate.

8. A method of manufacturing a semiconductor device, said method comprising the steps of:

(a) forming a film containing an organopolysiloxane, on at least one portion of a substrate of said semiconductor device wherein a circuit is embedded on a front surface of said substrate;

(b) treating said film with an organic solvent, so that a majority of said protective film is dissolved in said organic solvent and thereby removed from said substrate and that a first residue remains on said substrate;

(c) treating said first residue with a first aqueous solution containing at least one of hydrogen fluoride and ammonium fluoride, so that at least a portion of said first residue is dissolved in said first solution and removed from said substrate and that a second residue, which is less than said first residue in thickness, remains on said substrate;

(d) oxidizing said second residue to silicon oxide; and (e) treating said silicon oxide with a second aqueous solution containing at least one of hydrogen fluoride and ammonium fluoride so as to dissolve said silicon oxide in said second solution and to thereby remove said silicon oxide from said substrate.

9. A method according to claim 7, wherein the step (c) is conducted by irradiating said residue with an oxygen plasma, wherein the irradiation is controlled such that the electrical conditions of the semiconductor device are substantially undamaged.

10. A method according to claim 7, wherein the step (c) is conducted by irradiating said residue with ultraviolet rays in an atmosphere of ozone.

11. A method according to claim 7, wherein the step (c) is conducted by heating said residue in an atmosphere of oxygen.

12. A method according to claim 7, wherein the step (c) is conducted by immersing said residue in a solution mixture comprising a hot concentrated sulfuric acid and a hydrogen peroxide aqueous solution.

13. A method according to claim 7, wherein said organic solvent at the step (b) comprises alkylbenzene sulfonic acid.

14. A method according to claim 7, wherein said film has a thickness of at least 10 $\mu$m for protecting said substrate.

15. A method according to claim 7, wherein said residue has a thickness not greater than 10 nm.

16. A method according to claim 9, wherein said residue is irradiated at a power of not greater than 200 W, for a period of time of not longer than 5 minutes.

17. A method according to claim 7, wherein said film comprises a silicone resin.

18. A method according to claim 7, wherein said circuit comprises aluminum wiring.

19. A method according to claim 8, wherein said circuit comprises aluminum wiring.

* * * * *